United States Patent [19]

Turner et al.

[11] 4,306,146
[45] Dec. 15, 1981

[54] HIGH IMPEDANCE TRANSDUCER CIRCUIT

[75] Inventors: Peter R. Turner; John R. Norman, both of London, England

[73] Assignee: Molins Limited, London, England

[21] Appl. No.: 111,851

[22] Filed: Jan. 14, 1980

[30] Foreign Application Priority Data

Jan. 20, 1979 [GB] United Kingdom ................ 2125/79

[51] Int. Cl.³ ............................................. H01J 40/14
[52] U.S. Cl. .................. 250/214 R; 328/162
[58] Field of Search ............... 307/304, 311; 328/162, 328/165; 250/214 R, 206, 208, 209

[56] References Cited

U.S. PATENT DOCUMENTS 3,770,967  11/1973  Hanna et al. .................... 250/214 R
3,906,384   9/1975  Schiffman ......................... 328/162
4,173,723  11/1979  Temes et al. ..................... 307/304

Primary Examiner—David C. Nelms
Attorney, Agent, or Firm—Craig and Antonelli

[57] ABSTRACT

Electrical monitoring and/or control circuit including a high impedance transducer—for example a photodiode—which is situated remotely from a measuring circuit and linked to it by a balanced twisted pair of wires fed by a power MOSFET forming a "buffer". The arrangement is such that equal pulses of opposite phase are induced in the twin feeder when a pulse output is produced by the transducer, which is substantially noise-immune without the use of coaxial cable and without the necessity for situating all the measuring circuitry at the transducer position. May be used in "difficult" electrical environments, e.g. where there are electric motors such as in tobacco-feeding arrangements.

9 Claims, 3 Drawing Figures

HIGH IMPEDANCE TRANSDUCER CIRCUIT

This invention relates to electrical monitoring and/or control circuits including transducers. It has particular application to optical monitoring systems including transducers such as photo-diodes, which have "high importance" characteristics, in cases where they are to be located remotely from their co-operating signal processing or control circuitry. In such cases, particularly in environments where other electrical equipment is also operating, severe problems of electrical interference can arise even if extensive use is made of screened leads to carry the signals from the transducer.

A signal transmitting circuit including a high impedance, two terminal transducer device, according to one aspect of the present invention comprises a high input impedance three terminal active device of the kind in which an input voltage applied to a first terminal results in a change of effective impedance between the other two terminals the transducer being connected between the first terminal and one of the said other terminals; a pair of supply lines which are maintained at different voltages, in use; a pair of resistors of equal sizes comprising a split load, each one of which has one side connected to one of the supply lines; and a pair of wires each of which connects one of the said other terminals of the active device to the other side of one of the resistors.

Preferably, when the transducer is a photodiode the three terminal active device is a field effect transistor ("F.E.T."), the diode being connected between the "gate" and "drain" electrodes. A high value resistor may be connected in parallel with the diode, for pulse shaping purposes.

According to another aspect of the invention there is provided a signal transmitter head for an optical monitoring system, and adapted for use with a pair of remotely situated power supply lines, comprising a photodiode connected across the "gate" and "drain" terminals of a field effect transistor, whereby the source and drain terminals can be connected, in use, by means of a balanced twin wire system to a pair of remotely situated load resistors each connected to one of the supply lines, thereby providing a combined power supply and signal path for the transmitter head.

The pair of wires connecting the FET or other active device to the load resistors are preferably twisted together. They may then be made a considerable length, without the incidence of interference problems, because the action of the circuit of the invention is such that when a pulse is emitted by the transducer, output pulses of mutually equal magnitude but opposite sense, appear on the output electrodes of the active device. With this arrangement of the wires, any interference pulses will be induced equally and in phase in the two wires, which means that they can be easily distinguished from signal pulses since the latter will be equal to each other but in anti-phase.

Preferably, a signal processing circuit is provided to convert the output signal of the transducer circuit into a logic signal for control purposes, and may comprise a high pass filter connected to each load resistor; a differential comparator; and preferably, an amplifier. When "on/off" signals are required for control purposes, the amplifier may be followed by further stages arranged to form an integrating retriggerable monostable, so as to set a lower limit for the duration of the control pulses.

This signal processing circuit may also be used via the twin wire system, with a low-impedance two-terminal transducer device such as a proximity probe of the electromagnetic type which does not require the use of a FET as a "buffer". One example of such a probe is the PEPPERL & FUCHS (GB) LTD Type SJ 2.2-N, whose impedance characteristics are such that it can be connected directly across the input terminals of the twin wire feeder.

One embodiment of the invention will now be described by way of example with reference to the accompanying drawings, in which.

Figure 1:
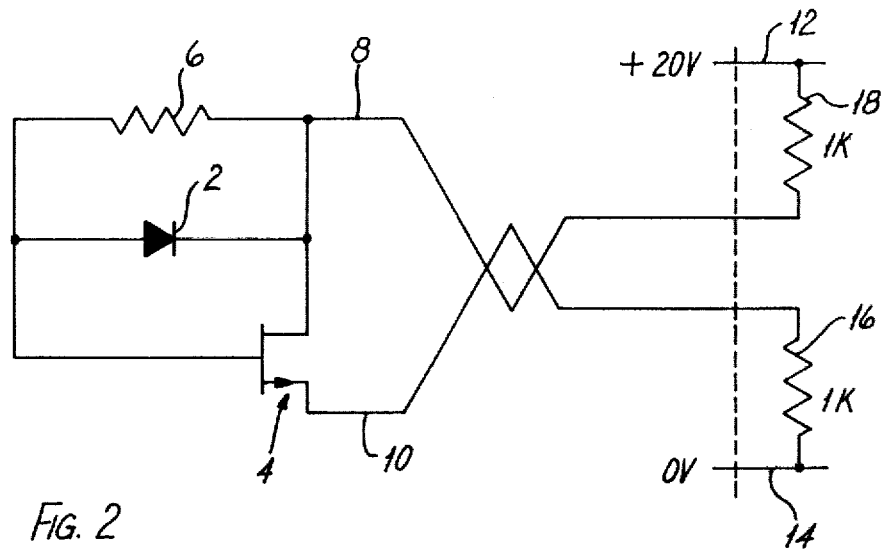
FIG. 1 is a circuit diagram of a transducer signal transmitter according to the invention.

Referring to FIG. 1, the signal transmitter "head" includes a photo-diode 2 which is arranged to detect the presence or absence of a "light-beam", which may be for example comprise non-visible light such as infra-red, to provide a control signal for a motor or the like. For example, the light-beam may pass through the path of material which is moving along a conveyor, and the photo-diode detector may be arranged to signal when more material is to fed onto the conveyor or when the material is stationary.

The photo-diode (in this example a PLESSEY SC100) is connected across the "gate" and "drain" terminals of a power FET 4 (in this example a SILICONIX 2N2666). A one-megohm resistor 6 is connected in parallel with the photo-diode. These three components form the signal transmitter "head" of the system and are situated as close together as possible at the desired detection position. It will be noted that no power supply leads as such are required at this position.

The head is in fact connected to its power supply via a balanced twin wire 8, 10 which also forms the signal path, in the following manner: The twin wires 8, 10 are connected to the supply lines 12, 14 at the location of the signal processing circuitry via respective one kilohm resistors 16, 18, so that the resistors form a split load for the FET. Thus it will be appreciated that when a light pulse is received by the photo-diode, which is operating in the voltage generation mode, it will emit a voltage pulse which will cause pulses of mutually equal magnitude but opposite sense to be produced across the load resistors. Since the feeder wires are twisted together, any interference pulses induced in them will be equal and of the same sense, so they can be easily distinguished, and eliminated, from the signal.

Figure 2:
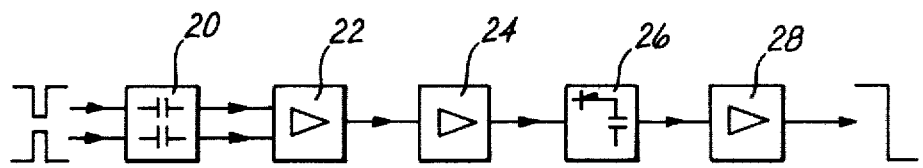
FIG. 2 is a block diagram of one type of suitable signal processing circuit for the transmitter of FIG. 1.
Figure 3:
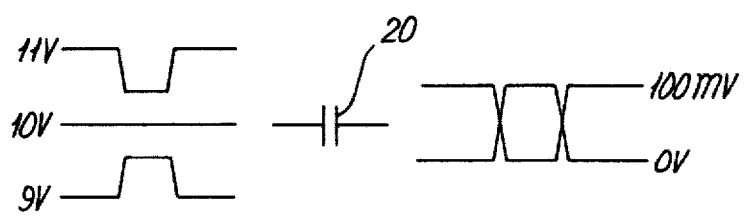
FIG. 3 shows the signal pulses at different points in the circuit of FIG. 2.

FIG. 2 shows the circuitry which carries out the detection of the desired signal, in block diagrammatic form, since its individual elements are conventional. The signals developed across the two load resistors are fed to parallel high pass filters 20, to remove d.c. components due to the bias condition of the transmitter circuitry, and a d.c. bias is applied to one of the signals to make the pulses overlap (FIG. 3). The resulting signals are then fed to the inputs of a differential comparator 22, which rejects common mode fluctuations. Thus the output of the comparator represents the interference free detector signal.

The circuit as shown also includes a further amplifier 24, diode pump 26, and level comparator 28, which are arranged to provide motor control signals for a feed device which is to be controlled by the optical detection system. This is achieved in the following way: The output from the amplifier 24 consists of negative-going pulses corresponding to articles or pieces of material which may for example be stationary in front of the detector, and thus blocking the light beam. The diode pump 26 and level comparator 28 form an integrating retriggerable monostable, whose time constant can be adjusted so that its output will remain in the "triggered" state for various periods of time. Thus it may be arranged to remain in this state, once an input pulse has been detected, for a period which includes a number of further pulses, so that the motor or other device being controlled is not switched on and off rapidly and repeatedly, or perhaps switched on in response to an isolated signal representing a single piece of detected material which is not significant to the operation of the system.

Although the invention has been described in its application to photo-detectors it will of course be appreciated that it could be applied to many other high impedance transducers.

What we claim as our invention and desire to secure by Letters Patent is:

1. An electrical signal transmitting system for a high impedance transducer of the type having two terminals, comprising
   (a) a high input impedance, three terminal active device of the kind in which an input voltage applied to the input terminal results in a change of effective impedance between the other two terminals; the said transducer being connected between the said input terminal and one of the said other terminals;
   (b) a pair of remotely-situated supply lines maintained at different voltages in use;
   (c) a pair of resistors comprising a split load, each having one side connected to one of the said supply lines; and
   (d) a pair of wires each of which connects one of the said other terminals of the active device, to the other side of one of the resistors.

2. An electrical signal transmitting system according to claim 1, in which the transducer is a photodiode and the three-terminal active device is a field effect transistor ("FET"), the photo-diode being connected between the "gate" and "drain" electrodes of the FET.

3. An electrical signal transmitting system according to claim 1 or claim 2, in which the said pair of resistors are of equal sizes.

4. An electrical signal transmitting system as claimed in claim 1, claim 2 or claim 3, in which the said pair of wires are twisted into a double helix.

5. An electrical signal transmitting system as claimed in claim 3 or claim 4 further comprising a signal processing circuit including:
   (a) a high pass filter connected to each load resistor, and
   (b) a differential comparator; the inputs of the said differential comparator each being connected to the output of one of the high pass filters, whereby the output of the differential comparator is indicative of the output of the transducer device.

6. An electrical signal transmitting system as claimed in claim 5, further comprising a machine-control-pulse generating circuit including
   (a) an amplifier connected to said differential comparator and
   (b) an integrating retriggerable monostable circuit connected to the output of said amplifier; whereby a control pulse will be produced at the output of said monostable whenever an output signal is received from said comparator, said control pulse having a predetermined minimum length.

7. A two-terminal signal transmitter head for an optical monitoring system, and adapted for use with a pair of remotely-situated power supply lines, comprising:
   (a) a photo-diode; and
   (b) a field-effect transistor ("FET"); the said photodiode being connected across the "gate" and "drain" terminals of the FET; whereby the "source" and "drain" terminals of the FET may be connected, in use, by means of a balanced twin-wire system to a pair of remotely situated load resistors each connected to one of the supply lines, to thereby provide a combined power supply and signal path for the transmitter head.

8. An electrical control system including operating-condition-sensing-means adapted to provide an output signal for a machine in response to the operating conditions, said control system comprising
   (a) two-terminal transducer means for sensing the said condition and producing a corresponding output signal;
   (b) a balanced twin feeder whose input is connected to the output of said transducer means;
   (c) a pair of remotely-situated power supply lines at different voltages;
   (d) a pair of load resistors of equal size, each connecting one of the outputs of the twin feeder to one of the supply lines;
   (e) a high pass filter connected to each load resistor;
   (f) a differential comparator, each of the inputs of the differential comparator being connected to the output of one of the high pass filters; and
   (g) control-pulse-shaping means connected to the output of said differential comparator.

9. A control system as claimed in claim 8 in which said control-pulse-shaping means comprises
   (a) an amplifier; and
   (b) an integrating retriggerable monostable to provide control pulses of a predetermined minimum length.

* * * * *